US012593178B2

(12) United States Patent
Huang et al.

(10) Patent No.:    US 12,593,178 B2
(45) Date of Patent:        Mar. 31, 2026

(54) MICRO-ELECTRO-MECHANICAL SYSTEM MICROPHONE PACKAGE

(71) Applicant: Fortemedia, Inc., Santa Clara, CA (US)

(72) Inventors: Yen-Son Paul Huang, Santa Clara, CA (US); Iou-Din Jean Chen, Fremont, CA (US); Shih-Chung Wang, Hsinchu City (TW); Yung-Wei Chen, Zhubei City (TW)

(73) Assignee: FORTEMEDIA, INC., Alviso, CA (US)

( * ) Notice: Subject to any disclaimer, the term of this patent is extended or adjusted under 35 U.S.C. 154(b) by 302 days.

(21) Appl. No.: 17/933,222

(22) Filed: Sep. 19, 2022

(65) Prior Publication Data

US 2023/0345184 A1        Oct. 26, 2023

Related U.S. Application Data

(60) Provisional application No. 63/334,731, filed on Apr. 26, 2022.

(51) Int. Cl.
H04R 19/04        (2006.01)
B81B 7/00        (2006.01)
(52) U.S. Cl.
CPC ........... H04R 19/04 (2013.01); B81B 7/0074 (2013.01); B81B 2201/0257 (2013.01); B81B 2203/0127 (2013.01); B81B 2203/0315 (2013.01); B81B 2207/012 (2013.01); B81B 2207/096 (2013.01); H04R 2201/003 (2013.01)

(58) Field of Classification Search
CPC .............. H04R 19/04; H04R 2201/003; B81B 7/0074; B81B 7/0032; B81B 2201/0257; B81B 2203/0127; B81B 2203/0315; B81B 2207/012; B81B 2207/096; B81B 2207/093; B81B 2207/091
USPC .......................................... 381/174, 369, 113
See application file for complete search history.

(56) References Cited

U.S. PATENT DOCUMENTS

| | | | |
|---|---|---|---|
| 2010/0284553 A1* | 11/2010 | Conti .................... | B81B 7/0061 |
| | | | 381/174 |
| 2017/0057810 A1* | 3/2017 | Murali .................. | B81B 7/0087 |
| 2023/0269524 A1* | 8/2023 | Chen ...................... | H04R 19/04 |
| | | | 381/103 |

* cited by examiner

*Primary Examiner* — Ahmad F. Matar
*Assistant Examiner* — Sabrina Diaz
(74) *Attorney, Agent, or Firm* — McClure, Qualey & Rodack, LLP

(57)        ABSTRACT

A micro-electro-mechanical system (MEMS) microphone package is provided. The MEMS microphone package includes a first micro-electro-mechanical system (MEMS) sensor die, an integrated circuit (IC) die and a first conductive lid. The first micro-electro-mechanical system (MEMS) sensor die has a first surface and a second surface opposite to the first surface. The IC die is stacked on the first surface of the first MEMS sensor die. The first conductive lid is disposed on the second surface of the first MEMS sensor die.

8 Claims, 8 Drawing Sheets

MICRO-ELECTRO-MECHANICAL SYSTEM MICROPHONE PACKAGE

CROSS REFERENCE TO RELATED APPLICATIONS

This application claims the benefit of U.S. Provisional Application No. 63/334,731, filed on Apr. 26, 2022, the entirety of which is incorporated by reference herein.

BACKGROUND OF THE INVENTION

Field of the Invention

The present invention relates to a micro-electro-mechanical system (MEMS) microphone package, and, in particular, to a wafer level chip scale MEMS microphone package.

Description of the Related Art

The current trend in personal electronics is toward fabricating slim, compact, lightweight and high-performance electronic devices, including microphones. A microphone is used to receive sound waves and convert acoustic signals into electrical signals. Microphones are widely used in daily life and are installed in such electronic products as telephones, mobiles phones, and recording pens. In a capacitive microphone, variations in acoustic pressure (i.e., local pressure deviation from the ambient atmospheric pressure caused by sound waves) force the diaphragm to deform correspondingly, and the deformation of the diaphragm induces a capacitance variation. The variation of acoustic pressure of the sound waves can thus be obtained by detecting the voltage difference caused by the capacitance variation.

This is distinct from conventional electret condenser microphones (ECM), in which mechanical and electronic elements of micro-electro-mechanical system (MEMS) microphones can be integrated on a semiconductor material using integrated circuit (IC) technology to fabricate a miniature microphone. MEMS microphones have such advantages as a compact size, being lightweight, and having low power consumption, and they have therefore entered the mainstream of miniaturized microphones.

Although existing MEMS microphones have generally been adequate for their intended purposes, they have not been entirely satisfactory in all respects. For example, existing MEMS microphone packages use bonding wires for electrical connections between MEMS devices and integrated circuit (IC) devices, a practice which still needs improvement in order to reduce device size, increase the acoustic and electrical performance, and decrease costs.

BRIEF SUMMARY OF THE INVENTION

An embodiment of the present invention provides a micro-electro-mechanical system (MEMS) microphone package. The MEMS microphone package comprises a first micro-electro-mechanical system (MEMS) sensor die, an integrated circuit (IC) die and a first conductive lid. The first micro-electro-mechanical system (MEMS) sensor die has a first surface and a second surface opposite to the first surface. The IC die is stacked on the first surface of the first MEMS sensor die. The first conductive lid is disposed on the second surface of the first MEMS sensor die.

An embodiment of the present invention provides a micro-electro-mechanical system (MEMS) microphone package. The MEMS microphone package comprises an integrated circuit (IC) die, a first micro-electro-mechanical system (MEMS) sensor die and a first conductive lid. The first MEMS sensor die is stacked on the IC die, wherein the first IC die is electrically connected to a first conductive bump in contact with the first MEMS sensor die. The first conductive lid is disposed on the first IC die to form a first cavity over the first MEMS sensor die.

In addition, an embodiment of the present invention provides a micro-electro-mechanical system (MEMS) microphone package. The MEMS microphone package comprises an integrated circuit (IC) die, a micro-electro-mechanical system (MEMS) sensor die and a conductive lid. The IC die comprises a through silicon via (TSV) structure. The MEMS sensor die is electrically connected to the through silicon via (TSV) structure. The conductive lid is disposed on the IC die, wherein the MEMS sensor die is disposed between the conductive lid and the IC die in a direction substantially vertical to a top surface of the IC die.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
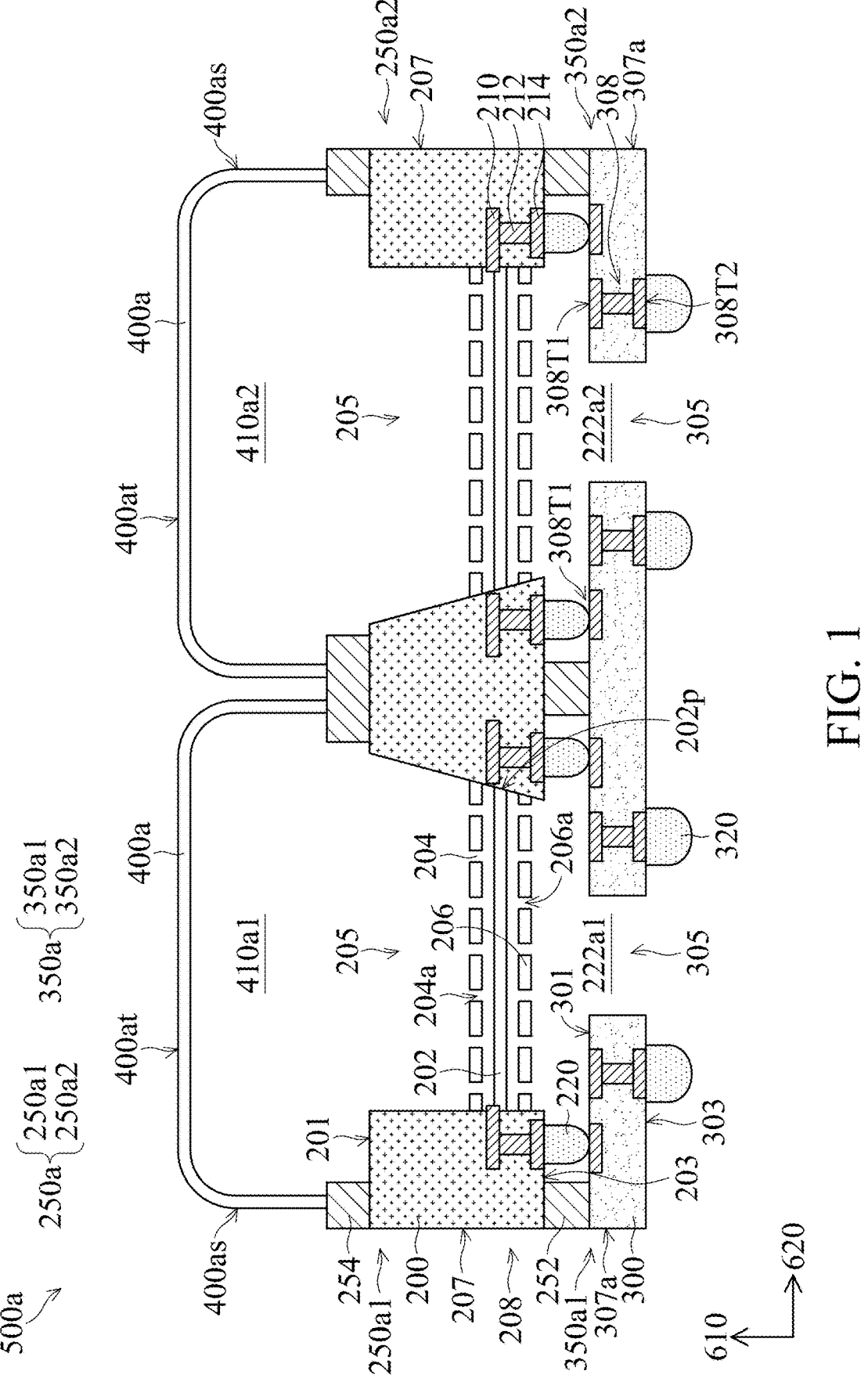
FIGS. 1-2 illustrate cross-sectional views of a micro-electro-mechanical system (MEMS) microphone package using a wafer-on-wafer (WoW) packaging technology in accordance with some embodiments of the disclosure.

The following description is made for the purpose of illustrating the general principles of the invention and should not be taken in a limiting sense. The scope of the invention is best determined by reference to the appended claims.

The inventive concept is described fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. Also, the drawings as illustrated are only schematic and are non-limiting. In the drawings, the size of some of the elements may be exaggerated for illustrative purposes and not drawn to scale. The dimensions and the relative dimensions do not correspond to actual dimensions in the practice of the invention Embodiments provide a micro-electro-mechanical system (MEMS) microphone package using a chip-on-chip (CoC) packaging technology, a chip-on-wafer (CoW) packaging technology, a wafer-on-wafer (WoW) packaging technology or a chip-on-substrate (CoS) packaging technology. The MEMS microphone package includes a MEMS sensor die, an integrated circuit (IC) die (such as an application-specific integrated circuit (ASIC) die) and a conductive lid. In some embodiments, the MEMS sensor die is stacked on the integrated circuit (IC) die, and the conductive lid is disposed on the IC die. The MEMS sensor die is electrically connected to the IC die by conductive bump structures rather than conductive wires. In addition, the IC die, which is fabricated by a wafer-level chip-scale packaging (WLCSP) technology, may include a through silicon via (TSV) structure formed through it, and it may be electrically connected to the MEMS sensor die. Therefore, the conductive path between the MEMS sensor die and the IC die can be reduced. Therefore, the impedance of the parasitic capacitance of the interface can also be reduced. Since the MEMS sensor die is vertically stacked on the IC die, the sizes of the conductive lid and the MEMS microphone package can be further reduced. Therefore, the MEMS microphone package can serve as a three-dimensional (3D) MEMS microphone package. In some embodiments, the IC die can be provided for the MEMS sensor die to be stacked upon and electrically connected to. The conductive lid can be disposed on the MEMS sensor die or the IC die. Therefore, the MEMS microphone package can be fabricated without a printed circuit board (PCB). The fabrication cost can be reduced. In some embodiments, the MEMS microphone package includes a plurality of MEMS sensor dies included in the same MEMS sensor wafer, a plurality of IC dies included in the same IC wafer, and a conductive lid. The MEMS sensor wafer is stacked on the IC wafer, and the conductive lid is disposed on the IC wafer. The MEMS sensor dies included in the MEMS microphone package (also serve as a MEMS microphone array package) are fabricated in the same MEMS sensor wafer. Therefore, the phase matching performance of the adjacent MEMS sensor dies of the MEMS microphone package can be improved.

Figure 2:
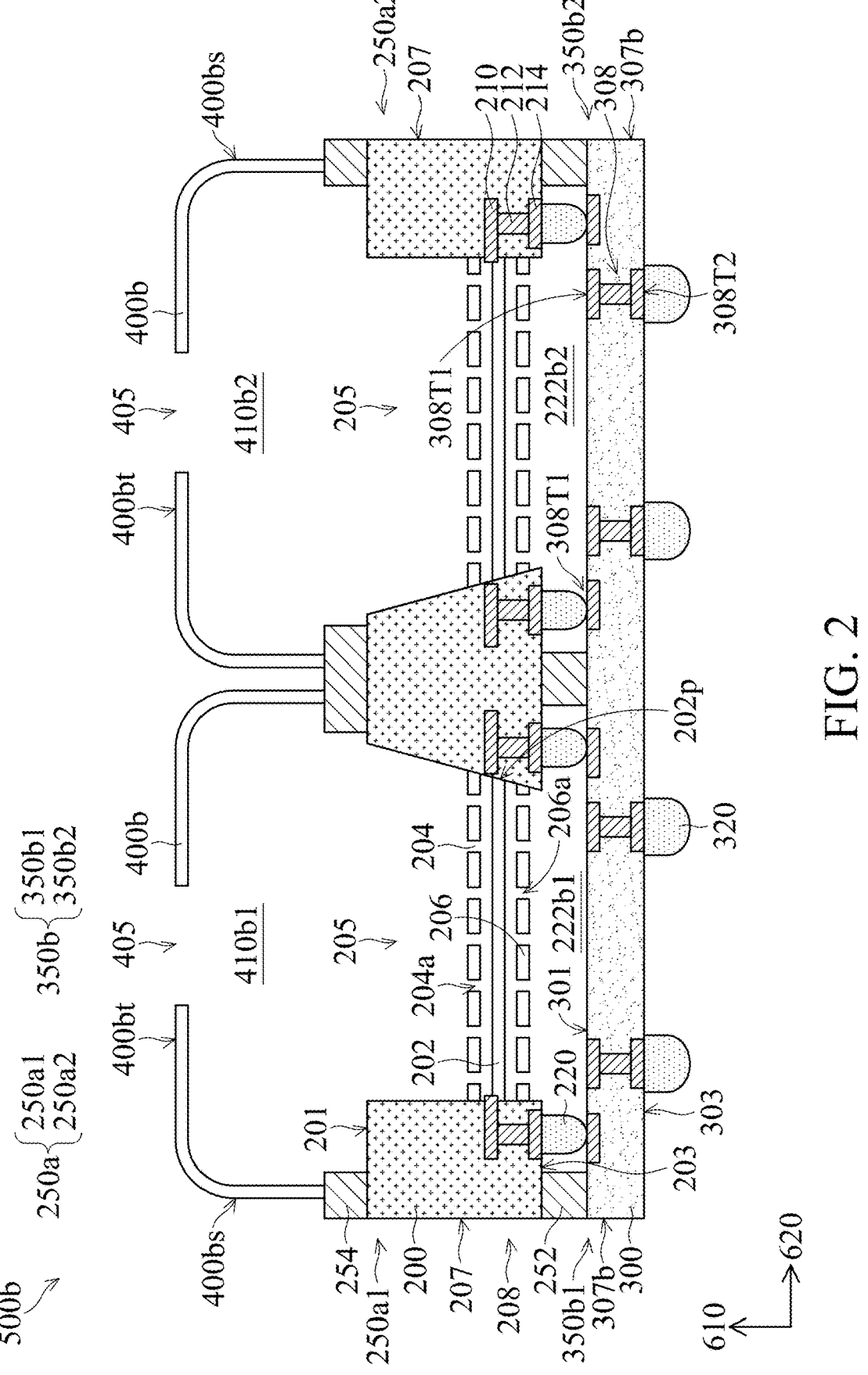

FIGS. 1-2 illustrate cross-sectional views of micro-electro-mechanical system (MEMS) microphone packages 500a and 500b using a wafer-on-wafer (WoW) packaging technology in accordance with some embodiments of the disclosure. Each of the MEMS microphone packages 500a and 500b is fabricated by vertically stacking a MEMS sensor wafer including a plurality of MEMS sensor dies arranged as an array on an IC wafer including a plurality of IC dies arranged as an array. Therefore, the MEMS microphone packages 500a and 500b may serve as MEMS microphone array packages 500a and 500b. In addition, each of the MEMS microphone packages 500a and 500b is fabricated by vertically stacking the MEMS sensor dies on the IC dies. Therefore, the MEMS microphone packages 500a and 500b may also serve as a three-dimensional (3D) MEMS microphone package.

FIG. 1 illustrates a cross-sectional view of the micro-electro-mechanical system (MEMS) microphone packages 500a using the wafer-on-wafer (WoW) packaging technology in accordance with some embodiments of the disclosure. As shown in FIG. 1, the MEMS microphone package 500a comprises MEMS sensor dies 250a1 and 250a2, the IC dies 350a1 and 350a2 and conductive lids 400a. The IC dies 350a1 and 350a2 are stacked on surfaces 203 of MEMS substrates 200 of the MEMS sensor die 250a1 and 250a2, respectively. The conductive lids 400a are disposed on surfaces 201 of the MEMS substrates 200 of the MEMS sensor die 250a1 and 250a2.

In some embodiments, the MEMS sensor die 250a1 is positioned beside and connected to the MEMS sensor die 250a2. The MEMS sensor die 250a1 and the MEMS sensor die 250a2 are arranged side-by-side. In some embodiments, the MEMS sensor die 250a1 and the MEMS sensor die 250a2 are identical MEMS sensor dies and arranged as an array. In addition, the MEMS sensor die 250a1 and the MEMS sensor die 250a2 are adjacent MEMS sensor dies fabricated in the same MEMS sensor wafer 250a (the MEMS sensor wafer 250a shown in the figures may be a portion of a MEMS sensor wafer) without separated from each other. In some embodiments, any number of MEMS sensor dies can be fabricated in the MEMS microphone package 500a, this being a design choice.

In some embodiments, each of the MEMS sensor dies 250a1 and 250a2 may be a capacitive microphone. In some embodiments, each of the MEMS sensor dies 250a1 and 250a2 comprises the MEMS substrate 200, a diaphragm 202 and a backplate 204. The MEMS substrate 200 of the MEMS sensor die 250a1 is in contact with the MEMS substrate 200 of the MEMS sensor die 250a2. The MEMS substrate 200 of the MEMS sensor dies 250a1 and 250a2 has opposing surfaces 201 and 203. The MEMS substrate 200 the MEMS sensor dies 250a1 and 250a2 is configured to support the diaphragm 202 and the backplate 204. As shown in FIG. 1, in some embodiments, the MEMS substrate 200 has an opening portion 205. The opening portion 205 allows sound waves received by each of the MEMS sensor dies 250a1 and 250a2 to pass through and/or enter the MEMS substrate 200. For example, the MEMS substrate 200 may include silicon or the like, but the present disclosure is not limited thereto.

The diaphragm 202 has a periphery portion 202p anchored to the MEMS substrate 200. The backplate 204 is mounted on the MEMS substrate 200 and over the diaphragm 202. In some embodiments, each of the MEMS sensor dies 250a1 and 250a2 comprises another backplate 206 mounted on the MEMS substrate 200 and over the diaphragm 202, such that the diaphragm 202 is positioned between and spaced apart from the backplate 204 and the backplate 206.

The backplate 204 and the backplate 206 are stationary element disposed on and supported by the MEMS substrate 200. Each of the backplates 204 and 206 may have enough stiffness that it will not bend or move when sound waves pass through them. In some embodiments, the backplates 204 and 206 include a number of acoustic holes 204a and 206a. Each acoustic hole 204a passes through the backplate 204, and each acoustic hole 206a passes through the backplate 206. The acoustic holes 204a and 206a are configured to allow sound waves to pass through.

As shown in FIG. 1, each of the MEMS sensor dies 250a1 and 250a2 further comprises an interconnect structure 208 formed in the MEMS substrate 200. When the sound waves pass through the MEMS sensor dies 250a1 and 250a2, the movements of the diaphragm 202 can be converted into electrical signals based on a transducer. The converted electrical signals may be communicated to the IC dies 350a1 and 350a2 by the interconnect structure 208. In some embodiments, the interconnect structure 208 may include conductive traces 210, vias 212 connected to the conductive traces 210, and pads 214 connected to the vias 212 and position close to the surface 203 of the MEMS substrate 200.

In some embodiments, the conductive traces 210, the vias 212, and the pads 214 are formed of conductive materials.

As shown in FIG. 1, the MEMS microphone package 500a further comprises conductive bump structures 220 disposed on the surface 203 of each of the MEMS sensor dies 250a1 and 250a2. In addition, the conductive bump structures 220 are in contact with the pads 214 of the interconnect structure 208 of each of the MEMS sensor dies 250a1 and 250a2. The MEMS sensor die 250a1 and 250a2 are respectively electrically connected to the IC dies 350a1 and 350a2 by the conductive bump structures 220 disposed therebetween. In some embodiments, the conductive bump structures 220 may include gold bumps, copper bumps or solder bumps.

As shown in FIG. 1, the MEMS microphone package 500a further comprises adhesives 252 applied between the MEMS sensor dies 250a1 and 250a2 and the IC dies 350a1 and 350a2. Therefore, the MEMS sensor wafer 250a may be secured to the IC wafer 350a by the adhesive 252. The adhesives 252 are disposed close to an edge 207 of the MEMS sensor wafer 250a and an edge 307a of the IC wafer 350a. In addition, the adhesives 252 are disposed between the conductive bump structures 220 in contact with the MEMS sensor die 250a1 and the conductive bump structures 220 in contact with the MEMS sensor die 250a2. Therefore, the adhesives 252 surrounding the conductive bump structures 220 in contact with the MEMS sensor dies 250a1 and the IC die 350a1 may acoustically seal the MEMS sensor dies 250a1 to the IC die 350a1 to form a cavity 222a1. The adhesives 252 surrounding the conductive bump structures 220 in contact with the MEMS sensor dies 250a2 and the IC die 350a2 may acoustically seal MEMS sensor dies 250a2 to the IC die 350a2 to form a cavity 222a2 isolated from the cavity 222a1. The adhesives 252 may serve as isolation features for the cavities 222a1 and 222a2. In some embodiments, the adhesive 252 may be formed of electrically conductive materials or non-conductive materials, such as silver paste, solder paste, glue, epoxy or other suitable materials.

As shown in FIG. 1, the IC die 350a1 is positioned beside and connected to the IC die 350a2. In addition, the IC dies 350a1 and 350a2 are disposed besides the MEMS sensor dies 250a1 and 250a2. In some embodiments, the IC die 350a1 and the IC die 350a2 are identical IC dies and arranged as an array and disposed corresponding to the MEMS sensor dies 250a1 and 250a2. The overlapping area between the MEMS sensor die 250a1 and the IC die 350a1 may be the same size as the area of the IC die 350a1. In addition, the overlapping area between the MEMS sensor die 250a2 and the IC die 350a2 may be the same size as the area of the IC die 350a2. Furthermore, the IC die 350a1 and the IC die 350a2 are adjacent IC dies fabricated in the same IC wafer 350a (the IC wafer 350a shown in the figures may be a portion of an IC wafer), which is provided for the MEMS sensor wafer 250a to be stacked upon, without separated from each other. Therefore, the overlapping area between the MEMS sensor wafer 250a and the IC wafer 350a may be the same size as the area of the IC wafer 350a. In some embodiments, any number of IC dies can be fabricated in the MEMS microphone package 500a, this being a design choice.

In some embodiments, each of the IC die 350a1 and the IC die 350a2 comprises an application-specific integrated circuit (ASIC) die. The IC dies 350a1 and 350a2 are configured to process electrical signals produced by the MEMS sensor dies 250a1 and 250a. As shown in FIG. 1, each of the IC dies 350a1 and 350a2 comprises an IC substrate 300 having a surface (top surface) 301 and a surface (bottom surface) 303 opposite to the surface 301. The surface 301 of the IC substrate 300 of each of the IC dies 350a1 and 350a2 is provided for the corresponding MEMS sensor die (the MEMS sensor die 250a1 or 250a2) disposed thereon. The surface 303 of the IC substrate 300 of each of the IC dies 350a1 and 350a2 is provided for conductive bump structures 320 electrically connected thereon. In some embodiments, the MEMS sensor dies 250a1 and 250a2 are stacked on the corresponding IC dies 350a1 and 350a2 in a direction 610 substantially vertical to the surface 301 of the IC substrate 300 of the corresponding IC dies 350a1 and 350a2.

As shown in FIG. 1, each of the IC die 350a1 and 350a2 comprises through silicon via (TSV) structures 308 fabricated by the wafer-level chip-scale packaging (WLCSP) technology. The TSV structures 308 pass through the IC dies 350a1 and 350a2 and are electrically connected to the corresponding MEMS sensor dies 250a1 and 250a2. The MEMS sensor dies 250a1 and 250a2 are electrically connected to the corresponding IC die 350a1 and 350a2 by the conductive bump structures 220 connected to the TSV structure 308. In some embodiments, the TSV structure 308 comprises terminal portions 308T1 and 308T2 respectively close to the surfaces 301 and 303 of the IC substrate 300. The terminal portion 308T1 of the TSV structure 308 may be designed to be in contact with the conductive bump structures 220 between the MEMS sensor dies 250a1 and 250a2 and the IC dies 350a1 and 350a2. The terminal portion 308T2 of the TSV structure 308 may be designed to be in contact with the conductive bump structures 320. Therefore, the conductive bump structures 220 and the conductive bump structures 320 are disposed on the opposite surfaces 301 and 303 of the IC substrate 300 of the IC dies 350a1 and 350a2, respectively. The conductive bump structures 320 are separated from the MEMS sensor dies 250a1 and 250a2 by the IC dies 350a1 and 350a. In some embodiments, the conductive bump structures 320 may include gold bumps, copper bumps or solder bumps. In some embodiments, the conductive bump structures 320 may be formed of different materials. For example, the bump structures 220 may include gold bumps, and the conductive bump structures 320 may include solder bumps.

As shown in FIG. 1, each of the IC dies 350a1 and 350a2 of the MEMS microphone package 500a has an acoustic port 305 passing through it so that each of the MEMS sensor dies 250a1 or 250a2 is exposed from the acoustic port 305. In some embodiments, the acoustic ports 305 formed in the IC dies 350a1 and 350a2 are configured to allow sound waves to enter the cavities 222a1 and 222a2. In some embodiments, the acoustic ports 305 in the IC dies 350a1 and 350a2 are substantially aligned with the opening portions 205 in the MEMS sensor dies 250a1 and 250a2, respectively.

As shown in FIG. 1, the conductive lids 400a are disposed on the IC dies 350a1 and 350a2 and attached to the surfaces 201 of the MEMS sensor dies 250a1 and 250a2. Since the MEMS sensor dies 250a1 and 250a2 are included in the MEMS sensor wafer 250a, the conductive lids 400a are also connected to the MEMS sensor wafer 250a. The MEMS sensor die 250a1 is disposed between the conductive lid 400a and the IC die 350a1 in the direction 610. In addition, the MEMS sensor die 250a2 is disposed between the conductive lid 400a and the IC die 350a2 in the direction 610. As shown in FIG. 1, the MEMS substrate 200 of the MEMS sensor die 250a1, the IC die 350a1 and the conductive lid 400a mounted on the MEMS substrate 200 of the MEMS sensor die 250*a*1 collectively form a housing, such that the diaphragm 202 of the MEMS sensor die 250*a*1 is enclosed in the housing. Further, the MEMS substrate 200 of the MEMS sensor die 250*a*2, the IC die 350*a*2 and the conductive lid 400*a* mounted on the MEMS substrate 200 of the MEMS sensor die 250*a*2 collectively form another housing, such that the diaphragm 202 of the MEMS sensor die 250*a*2 is enclosed in the housing. As shown in FIG. 1, the conductive lids 400*a* are connected to the surfaces 201 of the MEMS sensor dies 250*a*1 and 250*a*2 and collectively form cavities 410*a*1 and 410*a*2 over the MEMS sensor dies 250*a*1 and 250*a*2. In some embodiments, the conductive lid 400*a* is inverted U-shaped in a cross-section view as shown in FIG. 1. The conductive lid 400*a* has a top portion 400*at* and a sidewall portion 400*as* connected to the top portion 400*at*. The top portion 400*at* is formed extending in the direction 620 substantially parallel to the surfaces 301 of the IC substrates 300 of the corresponding IC dies 350*a*1 and 350*a*2. The sidewall portion 400*as* is formed extending in a direction 610 substantially vertical to the surfaces 301 of the IC substrates 300 of the corresponding IC dies 350*a*1 and 350*a*2. In some embodiments, as shown in FIG. 1, the sidewall portion 400*as* of the conductive lid 400*a* over the MEMS sensor die 250*a* and the IC die 350*a*1 is positioned directly on the MEMS sensor die 250*a*1 and the IC die 350*a*1. In some embodiments, as shown in FIG. 1, the sidewall portion 400*as* of the conductive lid 400*a* over the MEMS sensor die 250*a*2 and the IC die 350*a*2 is positioned directly on the MEMS sensor die 250*a*2 and the IC die 350*a*2. In some embodiments, the conductive lid 400*a* is formed of conductive materials, such as metals.

As shown in FIG. 1, the MEMS microphone package 500*a* further comprises adhesives 254 applied between the conductive lids 400*a* and the corresponding MEMS sensor dies 250*a*1 and 250*a*2. The conductive lids 400*a* may be secured to the MEMS sensor wafer 250*a* by the adhesives 254. Therefore, the adhesives 254 may hermetically seal the conductive lids 400*a* to the corresponding MEMS sensor dies 250*a*1 and 250*a*2 to form the cavities 410*a*1 and 410*a*2 to contain a volume of air above the MEMS sensor dies 250*a*1 and 250*a*2. In some embodiments, the adhesives 254 may include the same materials as the adhesives 252.

FIG. 2 illustrates a cross-sectional view of the micro-electro-mechanical system (MEMS) microphone package 500*b* using the wafer-on-wafer (WoW) packaging technology in accordance with some embodiments of the disclosure. Elements of the embodiments hereinafter, that are the same or similar as those previously described with reference to FIG. 1, are not repeated for brevity.

The difference between the MEMS microphone package 500*b* and the MEMS microphone package 500*a* is that the MEMS microphone package 500*b* includes an IC wafer 350*b* and conductive lids 400*b*. The MEMS microphone package 500*b* may arrange acoustic ports 405 in the conductive lids 400*b* disposed on IC dies 350*b*1 and 350*b*2 and attached to the surfaces 201 of the MEMS substrates 200 of the MEMS sensor dies 250*a*1 and 250*a*2. Therefore, the IC wafer 350*b* including the IC dies 350*b*1 and 350*b*2 attached to the surfaces 203 of the MEMS substrates 200 of MEMS sensor dies 250*a*1 and 250*a*2 can be formed without acoustic ports passing through it.

As shown in FIG. 2, each of the conductive lids 400*b* has an acoustic port 405 passing through it so that each of the MEMS sensor dies 250*a*1 and 250*a*2 is exposed from the acoustic port 405. As shown in FIG. 2, the conductive lids 400*b* are connected to the surfaces 201 of the MEMS sensor dies 250*a*1 and 250*a*2 and collectively form cavities 410*b*1 and 410*b*2 above the MEMS sensor dies 250*a*1 and 250*a*2. In some embodiments, the acoustic ports 405 formed in the conductive lids 400*b* are configured to allow sound waves to enter the opening portions 205 in the MEMS sensor die 250*a*1 or 250*a*2. In some embodiments, the acoustic ports 405 in the conductive lids 400*b* are substantially aligned with the opening portions 205 in the MEMS sensor die 250*a*1 or 250*a*2, respectively. Each of the conductive lid 400*b* has a top portion 400*bt* and a sidewall portion 400*bs* connected to the top portion 400*bt*. The top portion 400*bt* is formed extending in the direction 620 substantially parallel to the surfaces 301 of the IC substrates 300 of the corresponding IC dies 350*b*1 and 350*b*2. The sidewall portion 400*bs* is formed extending in the direction 610 substantially vertical to the surfaces 301 of the IC substrates 300 of the corresponding IC dies 350*b*1 and 350*b*2. In some embodiments, as shown in FIG. 2, the sidewall portion 400*bs* of the conductive lid 400*b* over the MEMS sensor die 250*a*1 and the IC die 350*b*1 is positioned directly on the MEMS sensor die 250*a*1 and the IC die 350*b*1. In some embodiments, as shown in FIG. 2, the sidewall portion 400*bs* of the conductive lid 400*b* over the MEMS sensor die 250*a*2 and the IC die 350*b*2 is positioned directly on the MEMS sensor die 250*a*2 and the IC die 350*b*2. In some embodiments, the conductive lid 400*b* comprises materials similar to or the same as the conductive lid 400*a*.

As shown in FIG. 2, the adhesives 252 are disposed close to an edge 307*b* of the IC wafer 350*b*. In addition, the adhesives 252 surrounding the conductive bump structures 220 in contact with the MEMS sensor dies 250*a*1 and the IC die 350*b*1 may acoustically seal the MEMS sensor dies 250*a*1 to the IC die 350*b*1 to form a cavity 222*b*1 to contain a volume of air between the MEMS sensor dies 250*a*1 and the IC die 350*b*1. The adhesives 252 surrounding the conductive bump structures 220 in contact with the MEMS sensor dies 250*a*2 and the IC die 350*b*2 may acoustically seal MEMS sensor dies 250*a*2 to the IC die 350*b*2 to form a cavity 222*b*2 to contain a volume of air between the MEMS sensor dies 250*b*2 and the IC die 350*b*2 and isolated from the cavity 222*b*1. The adhesives 252 may serve as isolation features for the cavities 222*b*1 and 222*b*2.

The MEMS microphone packages 500*a* and 500*b* are fabricated using the wafer-on-wafer (WoW) packaging technology. The MEMS sensor dies 250*a*1 and 250*a*2 fabricated in the same MEMS sensor wafer 250*a* can be stacked on and electrically connected to the corresponding IC dies 350*a*1 and 350*a*2 (or the IC dies 350*b*1 and 350*b*2) fabricated in the same IC wafer 350*a* (or the IC wafer 350*b*) by the conductive bumps structures 220 rather than conductive wires. In addition, the IC dies 350*a*1 and 350*a*2 (or the IC dies 350*b*1 and 350*b*2) in the same IC wafer 350*a* (or the IC wafer 350*b*) comprise the TSV structure 308 fabricated by the wafer-level chip-scale packaging (WLCSP) technology. Therefore, the conductive paths between the MEMS sensor dies 250*a*1 and 250*a*2 and the corresponding IC dies 350*a*1 and 350*a*2 (or the IC dies 350*b*1 and 350*b*2) can be reduced. Therefore, the impedance of the parasitic capacitance of the interface of the MEMS microphone packages 500*a* and 500*b* can also be reduced. Since the MEMS sensor dies 250*a*1 and 250*a*2 are vertically stacked on the corresponding IC dies 350*a*1 and 350*a*2 (or the IC dies 350*b*1 and 350*b*2), the sizes of the conductive lids 400*a* (or the conductive lids 400*b*) and the MEMS microphone packages 500*a* and 500*b* can be further reduced. Therefore, the MEMS microphone packages 500*a* and 500*b* can serve as three-dimensional (3D) MEMS microphone packages. Further, the IC dies 350*a*1 and 350*a*2 (or the IC dies 350*b*1 and 350*b*2) can be provided for the corresponding MEMS sensor dies 250a1 and 250a2 to be stacked upon and electrically connected to. The conductive lids 400a (or the conductive lids 400b) can be bonded on the corresponding MEMS sensor dies 250a1 and 250a2 and the IC dies 350a1 and 350a2 (or the IC dies 350b1 and 350b2). Therefore, the MEMS microphone packages 500a and 500b may output audio signal without bonding a printed circuit board (PCB). The fabrication cost can be reduced. Moreover, the MEMS microphone packages 500a and 500b each includes a plurality of MEMS sensor dies 250a1 and 250a2 fabricated in the same MEMS sensor wafer 250a stacked on a plurality of IC dies 350a1 and 350a2 (or the IC dies 350b1 and 350b2) fabricated in the same IC wafer 350a (or the IC wafer 350b). Therefore, the phase matching performance of the adjacent MEMS sensor dies of the MEMS microphone package can be improved.

Figure 3:
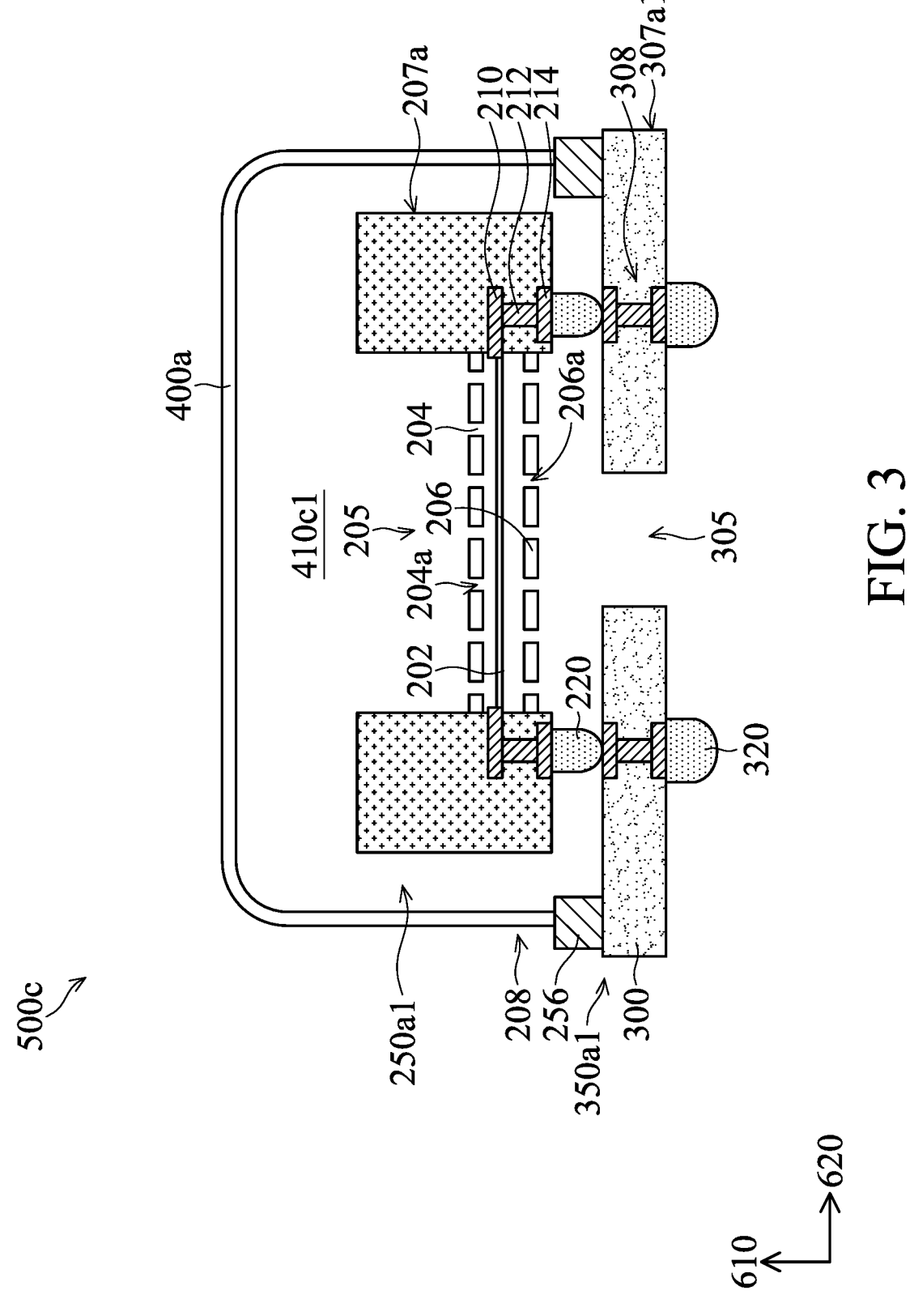
FIGS. 3-4 illustrate cross-sectional views of a micro-electro-mechanical system (MEMS) microphone package using a chip-on-chip (CoC) packaging technology in accordance with some embodiments of the disclosure.
Figure 4:
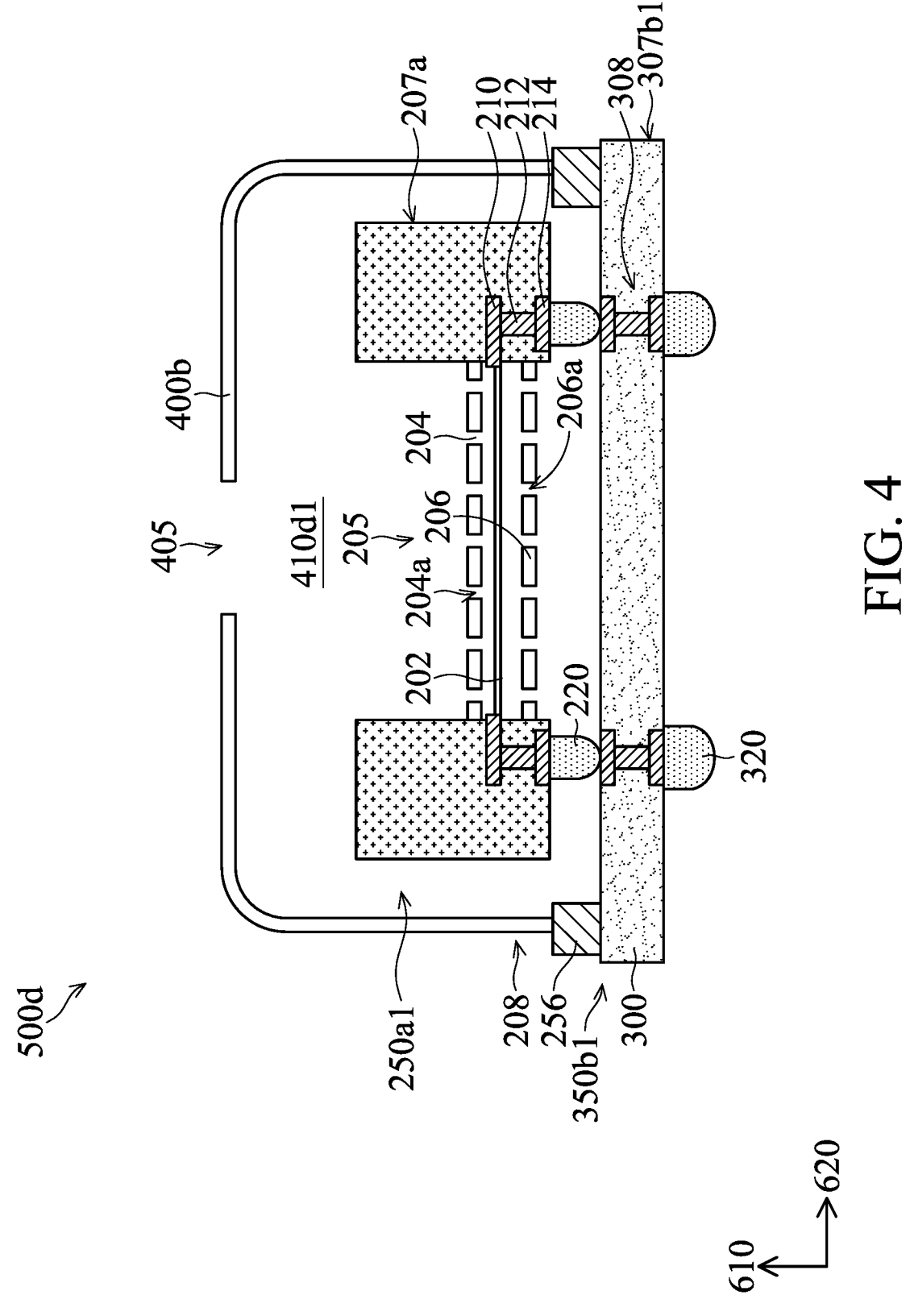

FIGS. 3-4 illustrate cross-sectional views of micro-electro-mechanical system (MEMS) microphone packages 500c and 500d using the chip-on-chip (CoC) packaging technology in accordance with some embodiments of the disclosure. Elements of the embodiments hereinafter, that are the same or similar as those previously described with reference to FIGS. 1 and 2, are not repeated for brevity.

FIG. 3 illustrates a cross-sectional view of the micro-electro-mechanical system (MEMS) microphone package 500c using the chip-on-chip (CoC) packaging technology in accordance with some embodiments of the disclosure. The difference between the MEMS microphone package 500c and the MEMS microphone package 500a is that the MEMS microphone package 500c is designed to package a single MEMS sensor die 250a1 and a single IC die 350a1. A single conductive lid 400a is bonded on and connected to the IC die 350a1 to collectively form a cavity 410c1 accommodating the MEMS sensor die 250a1. As shown in FIG. 3, the single MEMS sensor die 250a1 is stacked on the single IC die 350a1 in the direction 610. The MEMS sensor die 250a1 is electrically connected to the corresponding IC die 350a1 by the conductive bumps structures 220. In some embodiments, the overlapping area between the MEMS sensor die 250a1 and the IC die 350a1 is less than the area of the IC die 350a1. Therefore, an edge 207a of the MEMS sensor die 250a1 is positioned within an edge 307a1 of the IC die 350a1. The surface 301 of the IC substrate 300 of the IC die 350a1 is partially covered by the MEMS sensor die 250a1.

As shown in FIG. 3, the MEMS microphone package 500c comprises adhesives 256 close to the edge 307a1 of the IC die 350a1 and between the conductive lid 400a and the IC die 350a1. The adhesives 256 is positioned surrounding the conductive bump structures 220 in contact with the MEMS sensor dies 250a1 and the IC die 350a1. The adhesives 256 may hermetically and acoustically seal the conductive lid 400a to the IC die 350a1 to form a cavity 410c1 to contain a volume of air surrounding the MEMS sensor die 250a1. In other word, the conductive lid 400a, the adhesives 256 and the IC die 350a1 may collectively form a housing, such that the MEMS sensor die 250a1 is enclosed in the housing. In some embodiments, the adhesives 256 may include the same materials as the adhesives 252 and 254.

As shown in FIG. 3, the IC die 350a1 of the MEMS microphone package 500c has an acoustic port 305 passing through it to allow sound waves to enter the cavity 410c1. In some embodiments, the acoustic port 305 in the IC die 350a1 is substantially aligned with the opening portion 205 in the MEMS sensor die 250a1.

FIG. 4 illustrates a cross-sectional view of the micro-electro-mechanical system (MEMS) microphone package

500d using the chip-on-chip (CoC) packaging technology in accordance with some embodiments of the disclosure. The difference between the MEMS microphone package 500d and the MEMS microphone package 500c is that the MEMS microphone package 500d includes a single IC die 350b1 and a single conductive lid 400b. The MEMS microphone package 500d is designed to package a single MEMS sensor die 250a1 and a single IC die 350b1. The single conductive lid 400b is connected to the IC die 350b1 by the adhesives 256 close to the edge 307b1 of the IC die 350b1 to collectively form a cavity 410d1 accommodating the MEMS sensor die 250a1.

As shown in FIG. 4, the MEMS microphone package 500d may arrange the acoustic port 405 in the conductive lid 400b disposed on the IC die 350b1. Therefore, the IC die 350b1 can be formed without acoustic ports passing through it. In some embodiments, the acoustic port 405 formed in the conductive lid 400b is configured to allow sound waves to enter the opening portion 205 in the MEMS sensor die 250a1. In some embodiments, the acoustic port 405 in the conductive lids 400b is substantially aligned with the opening portion 205 in the MEMS sensor die 250a1.

As shown in FIG. 4, the adhesives 256 may hermetically and acoustically seal the conductive lid 400b to the IC die 350b1 to form the cavity 410d1 to contain a volume of air surrounding the MEMS sensor die 250a1. In other word, the conductive lid 400b, the adhesives 256 and the IC die 350b1 may collectively form a housing, such that the MEMS sensor die 250a1 is enclosed in the housing.

The MEMS microphone packages 500c and 500d are fabricated using the chip-on-chip (CoC) packaging technology. The MEMS sensor die 250a1 can be stacked on and electrically connected to the corresponding IC die 350a1 (or the IC die 350b1) by the conductive bumps structures 220 rather than conductive wires. In addition, the IC die 350a1 (or the IC die 350b1) comprises the TSV structure 308 fabricated by the wafer-level chip-scale packaging (WLCSP) technology. Therefore, the conductive paths between the MEMS sensor die 250a1 and the corresponding IC die 350a1 (or the IC die 350b1) can be reduced. Therefore, the impedance of the parasitic capacitance of the interface of the MEMS microphone packages 500c and 500d can also be reduced. Since the MEMS sensor die 250a1 is vertically stacked on the corresponding IC die 350a1 (or the IC die 350b1), the size of the conductive lids 400a (or the conductive lids 400b) and the MEMS microphone packages 500c and 500d can be further reduced. Therefore, the MEMS microphone packages 500c and 500d can serve as three-dimensional (3D) MEMS microphone packages. Further, the IC die 350a1 (or the IC die 350b1) can be provided for the corresponding MEMS sensor die 250a1 to be stacked upon and electrically connected to. The conductive lids 400a (or the conductive lids 400b) can be disposed on the IC die 350a1 (or the IC die 350b1) to form the cavity 410c1 (or the cavity 410c2) for the MEMS sensor die 250a1 disposed therein. Therefore, the MEMS microphone packages 500c and 500d can output audio signal without bonding a printed circuit board (PCB). The fabrication cost can be reduced.

Figure 5:
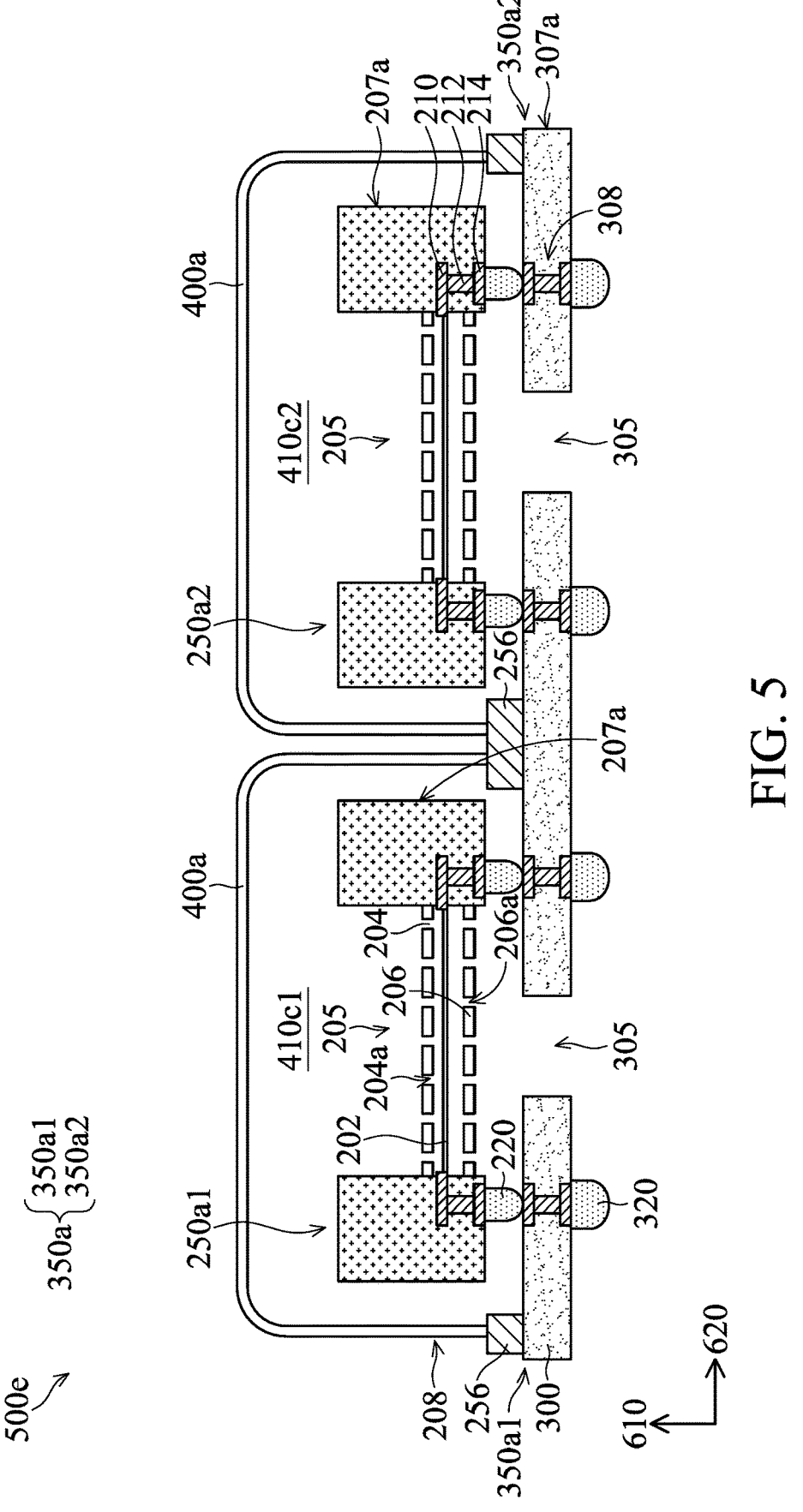
FIGS. 5-6 illustrate cross-sectional views of a micro-electro-mechanical system (MEMS) microphone package using a chip-on-wafer (CoW) packaging technology in accordance with some embodiments of the disclosure.
Figure 6:
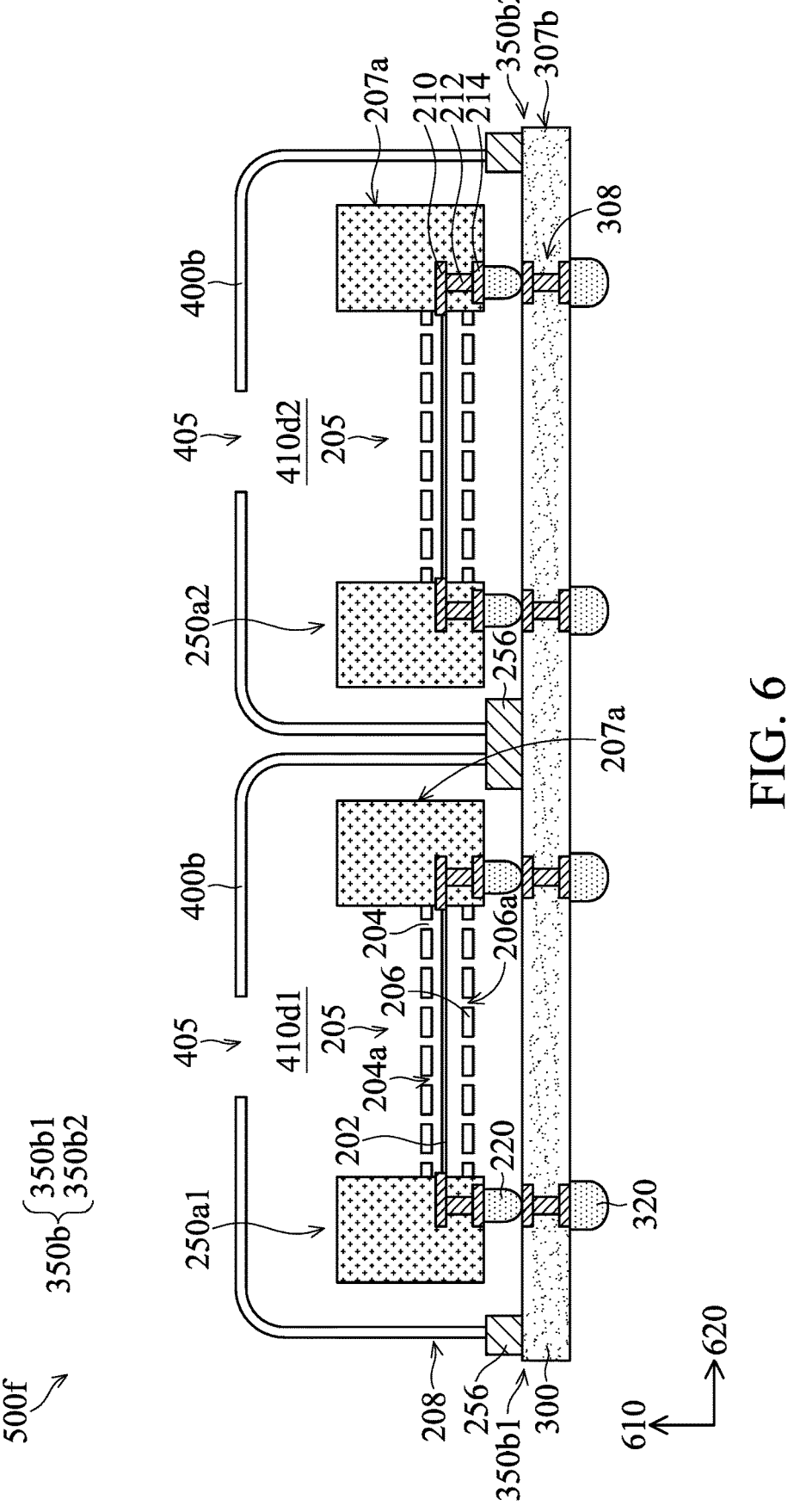

FIGS. 5-6 illustrate cross-sectional views of micro-electro-mechanical system (MEMS) microphone packages 500e and 500f using a chip-on-wafer (CoW) packaging technology in accordance with some embodiments of the disclosure. Elements of the embodiments hereinafter, that are the same or similar as those previously described with reference to FIGS. 1-4, are not repeated for brevity.

Each of the MEMS microphone packages 500e and 500f is fabricated by vertically stacking a plurality of individual MEMS sensor dies arranged as an array on an IC wafer including a plurality of IC dies arranged as an array. Therefore, the MEMS microphone packages 500e and 500f may serve as MEMS microphone array packages 500e and 500f. In addition, each of the MEMS microphone packages 500e and 500f is fabricated by vertically stacking the MEMS sensor dies on the IC dies comprising the TSV structures that passing through. Therefore, the MEMS microphone packages 500e and 500f may also serve as a three-dimensional (3D) MEMS microphone package.

FIG. 5 illustrates a cross-sectional view of micro-electro-mechanical system (MEMS) microphone package 500e using the chip-on-wafer (CoW) packaging technology in accordance with some embodiments of the disclosure. The difference between the MEMS microphone package 500e and the MEMS microphone package 500a is that the MEMS microphone package 500e is designed to package the MEMS sensor dies 250a1 and 250a2 separated from each other and the IC wafer 350a including the IC dies 350a1 and 350a2 connecting to each other. The conductive lids 400a are connected to the IC dies 350a1 and 350a2 to collectively form cavities 410c1 and 410c2 accommodating the MEMS sensor dies 250a1 and 250a2, respectively. As shown in FIG. 5, the discrete MEMS sensor dies 250a1 and 250a2 are stacked on the IC dies 350a1 and 350a2 included in the IC wafer 350a in the direction 610. The individual MEMS sensor dies 250a1 and 250a2 are electrically connected to the corresponding IC dies 350a1 and 350a2 by the conductive bumps structures 220. In some embodiments, the overlapping area between the MEMS sensor die 250a1 (or the MEMS sensor die 250a2) and the IC wafer 350a is less than the area of the IC wafer 350a. Therefore, the edge 207a of the MEMS sensor die 250a1 (or the MEMS sensor die 250a2) is positioned within the edge 307a of the IC wafer 350a. The surface 301 of the IC substrate 300 of the IC wafer 350a is partially covered by the MEMS sensor die 250a1 (or the MEMS sensor die 250a2). In some embodiments, the individual MEMS sensor dies 250a1 and 250a2 are arranged as an array. Any number of MEMS sensor dies can be fabricated in the MEMS microphone package 500e, this being a design choice. In addition, the number of IC dies corresponds to the number of MEMS sensor dies.

As shown in FIG. 5, the MEMS microphone package 500e comprises adhesives 256 close to the edge 307a of the IC wafer 350a and between the conductive lids 400a and the IC wafer 350a. In addition, the adhesives 256 are disposed between the conductive bump structures 220 in contact with the MEMS sensor die 250a1 and the conductive bump structures 220 in contact with the MEMS sensor die 250a2 separated from the MEMS sensor die 250a1. The adhesives 256 may hermetically and acoustically seal the conductive lids 400a to the IC wafer 350a to form cavities 410c1 and 410c2 to contain a volume of air surrounding the MEMS sensor dies 250a1 and the 250a2, respectively. In other word, the conductive lids 400a over the MEMS sensor dies 250a1 and 250a2 may form different housings with the adhesives 256 and the IC wafer 350a, such that the MEMS sensor dies 250a1 and 250a2 are enclosed in the different housings. In some embodiments, the adhesives 256 may include the same materials as the adhesives 252 and 254

As shown in FIG. 5, the IC dies 350a1 and 350a2 in the same IC wafer 350a of the MEMS microphone package 500e have acoustic ports 305 passing through them to allow sound waves to enter the cavities 410c1 and 410c2. In some embodiments, the acoustic ports 305 in the IC dies 350a1 and 350a2 are substantially aligned with the opening portions 205 in the MEMS sensor dies 250a1 and 250a2, respectively.

FIG. 6 illustrates a cross-sectional view of micro-electro-mechanical system (MEMS) microphone package 500f using the chip-on-wafer (CoW) packaging technology in accordance with some embodiments of the disclosure. The difference between the MEMS microphone package 500f and the MEMS microphone package 500e is that the MEMS microphone package 500f includes the IC wafer 350b and the conductive lids 400b. The MEMS microphone package 500f is designed to package the discrete MEMS sensor dies 250a1 and 250a2 and the IC wafer 350b. The conductive lids 400b are connected to the IC dies 350b1 and 350b2 to collectively form cavities 410d1 and 410d2 accommodating the MEMS sensor dies 250a1 and 250a2.

As shown in FIG. 6, the MEMS microphone package 500f may arrange the acoustic ports 405 in the conductive lids 400b disposed on the IC wafer 350b. Therefore, the IC wafer 350b can be formed without acoustic ports passing through it. In some embodiments, the acoustic ports 405 formed in the conductive lids 400b are configured to allow sound waves to enter the opening portions 205 in the MEMS sensor dies 250a1 and 250a2. In some embodiments, the acoustic ports 405 in the conductive lids 400b are substantially aligned with the opening portions 205 in the MEMS sensor dies 250a1 and 250a2, respectively.

As shown in FIG. 6, the adhesives 256 may hermetically and acoustically seal the conductive lids 400b to the IC wafer 350b to form the cavities 410d1 and 410d2 to contain a volume of air surrounding the MEMS sensor dies 250a1 and 250a2. In other word, the conductive lids 400d may collectively form different housings with the adhesives 256 and the IC die 350b1, such that the MEMS sensor dies 250a1 and 250a2 are enclosed in the different housings.

The MEMS microphone packages 500e and 500f are fabricated using the chip-on-wafer (CoW) packaging technology. The individual MEMS sensor dies 250a1 and 250a2 can be stacked on and electrically connected to the corresponding IC dies 350a1 and 350a2 fabricated in the same IC wafer 350a (or the IC dies 350b1 and 350b2 fabricated in the same the IC wafer 350b) by the conductive bumps structures 220 rather than conductive wires. In addition, the IC dies 350a1 and 350a2 in the same IC wafer 350a (or the IC dies 350b1 and 350b2 in the same the IC wafer 350b) comprise the TSV structure 308 fabricated by the wafer-level chip-scale packaging (WLCSP) technology. Therefore, the conductive paths between the MEMS sensor dies 250a1 and 250a2 and the corresponding IC dies 350a1 and 350a2 (or the IC dies 350b1 and 350b2) can be reduced. Therefore, the impedance of the parasitic capacitance of the interface of the MEMS microphone packages 500e and 500f can also be reduced. Since the MEMS sensor dies 250a1 and 250a2 are vertically stacked on the corresponding IC dies 350a1 and 350a2 (or the IC dies 350b1 and 350b2), the size of the conductive lids 400a (or the conductive lids 400b) and the MEMS microphone packages 500e and 500f can be further reduced. Therefore, the MEMS microphone packages 500e and 500f can serve as three-dimensional (3D) MEMS microphone packages. Further, the IC wafer 350a (or the IC wafer 350b) can be provided for the corresponding MEMS sensor dies 250a1 and 250a2 to be stacked upon and electrically connected to. The conductive lids 400a (or the conductive lids 400b) can be disposed on the corresponding IC dies 350a1 and 350a2 (or the IC dies 350b1 and 350b2) to form the cavities 410c1 and 410c2 (or the cavities 410d1 and 410d2) for the discrete MEMS sensor dies 250a1 and 250a2 disposed therein. Therefore, the MEMS microphone packages 500e and 500f can output audio signal without bonding a printed circuit board (PCB). The fabrication cost can be reduced.

Figure 7:
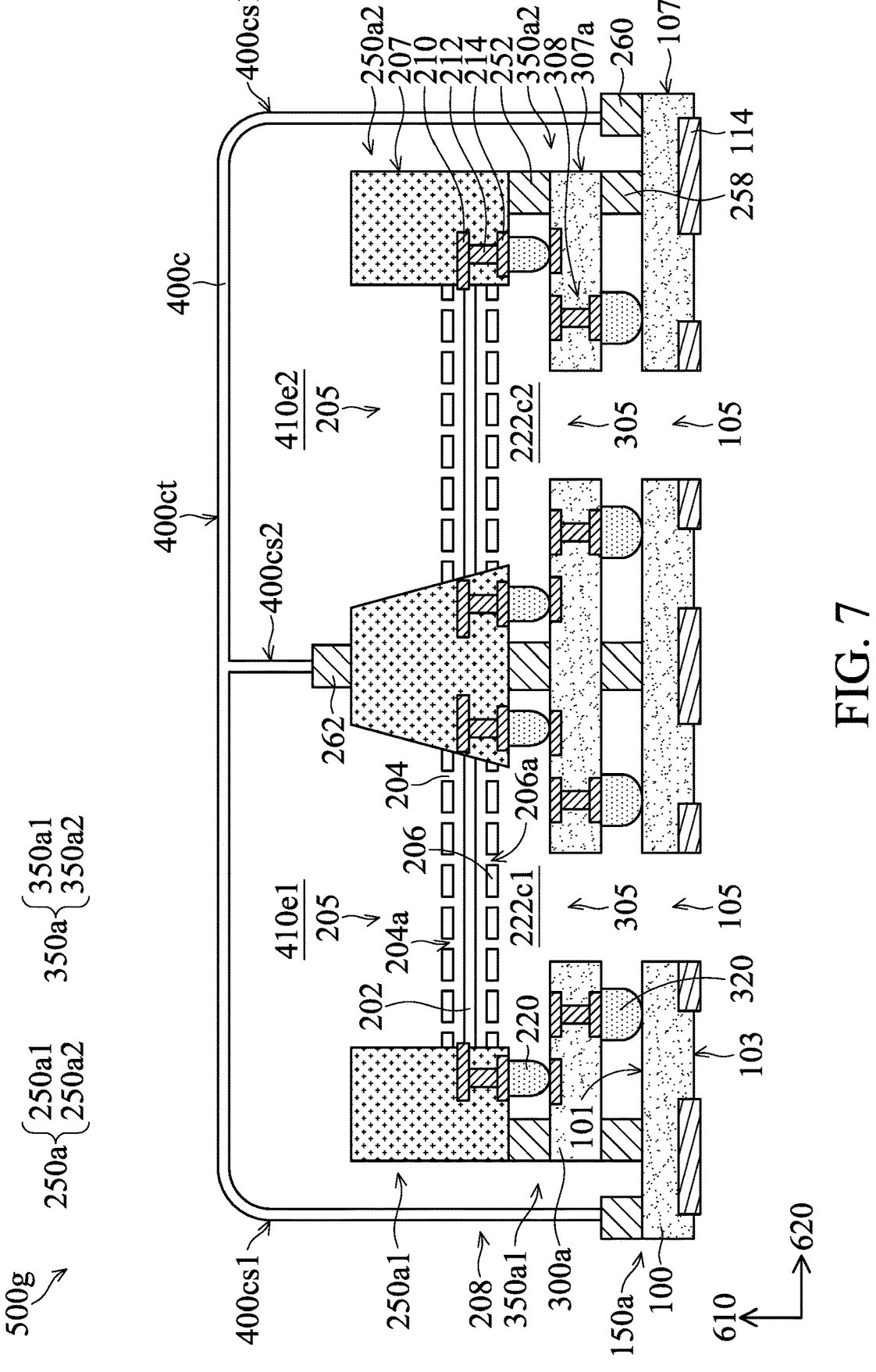
FIGS. 7-8 illustrate cross-sectional views of a micro-electro-mechanical system (MEMS) microphone package using a wafer-on-wafer (WoW) packaging technology in accordance with some embodiments of the disclosure.
Figure 8:
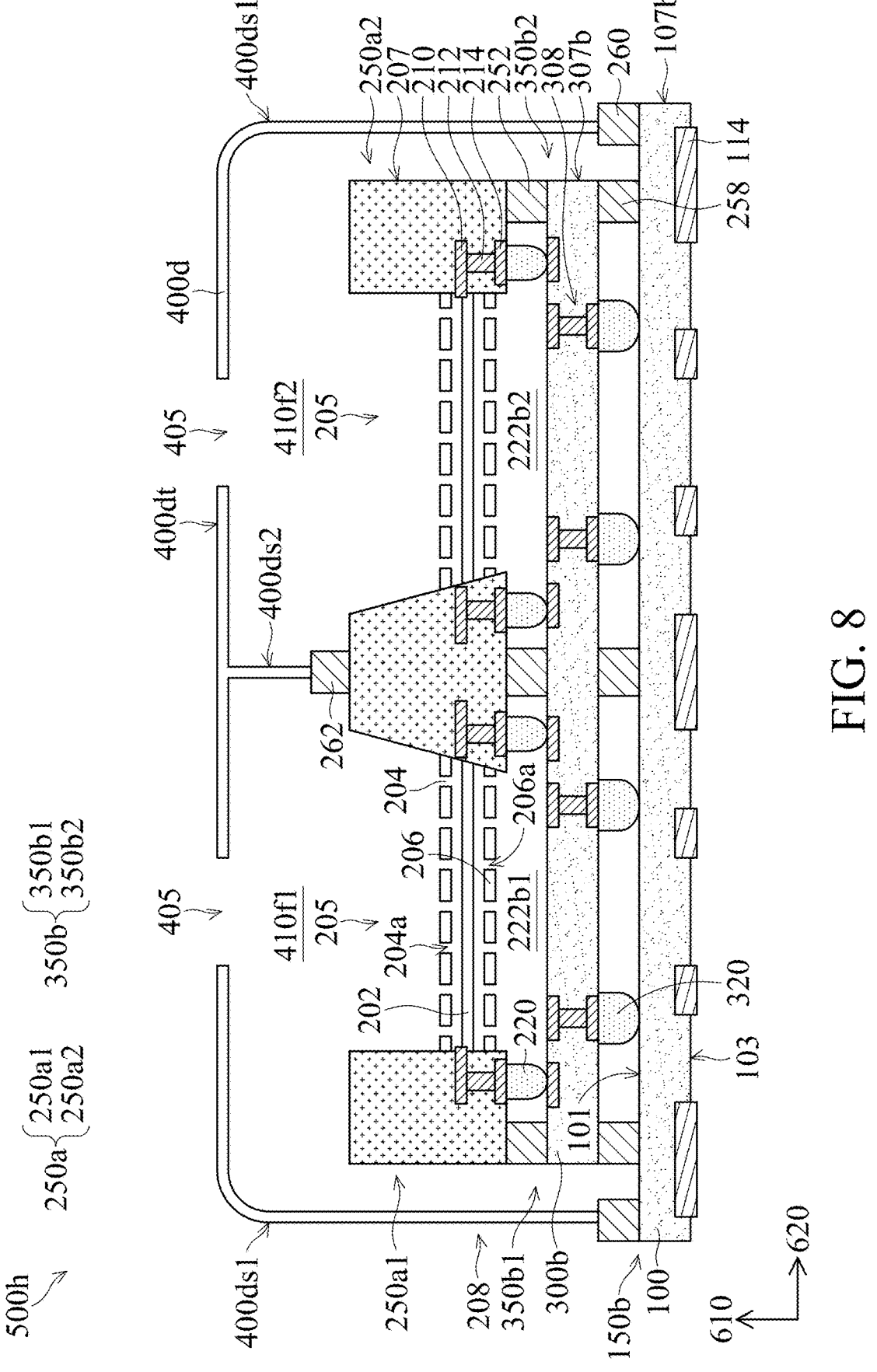

FIGS. 7-8 illustrate cross-sectional views of micro-electro-mechanical system (MEMS) microphone packages 500g and 500h using the wafer-on-wafer (WoW) packaging technology in accordance with some embodiments of the disclosure. Elements of the embodiments hereinafter, that are the same or similar as those previously described with reference to FIGS. 1-6, are not repeated for brevity. The MEMS microphone packages 500g and 500h are designed to package a MEMS sensor wafer including a plurality of MEMS sensor dies arranged as an array and vertically stacked on an IC wafer including a plurality of IC dies arranged as an array. In addition, the MEMS sensor wafer and the IC wafer stacked on each other are bonded on a printed circuit board (PCB). Therefore, the MEMS microphone packages 500g and 500h may serve as MEMS microphone array packages 500g and 500h. The MEMS microphone packages 500g and 500h may also serve as a three-dimensional (3D) MEMS microphone package.

FIG. 7 illustrates a cross-sectional view of the micro-electro-mechanical system (MEMS) microphone package 500g using the wafer-on-wafer (WoW) packaging technology in accordance with some embodiments of the disclosure. The difference between the MEMS microphone package 500g and the MEMS microphone array package 500a is that the MEMS microphone package 500g comprises a printed circuit board (PCB) 150a and a conductive lid 400c. The PCB 150a is provided for the IC wafer 350a including the IC dies 350a1 and 350a2 and the MEMS sensor wafer 250a including the MEMS sensor dies 250a1 and 250a2 to be stacked upon, so that the IC dies 350a1 and 350a2 are positioned between the MEMS sensor dies 250a1 and 250a2 and the PCB 150a in the direction 610, respectively.

As shown in FIG. 7, the PCB 150a comprises a PCB substrate 100 having a surface (top surface) 101 and a surface (bottom surface) 103 opposite to the surface 101. The surface 101 of the PCB substrate 100 of the PCB 150a is provided for the stacked MEMS sensor wafer 250a (including the MEMS sensor dies 250a1 and 250a2) and the IC wafer 350a (including the IC dies 350a1 and 350a2) to be disposed on. The surface 103 is provided for the conductive bump structures (not shown) that are electrically connected to the surface 103 to output audio signals. In some embodiments, the PCB 150a comprises conductive traces (not shown) and pads 114 positioned close to the surface 103 of the PCB substrate 100. In some embodiments, the conductive traces and the pads 114 are formed of conductive materials. In some embodiments, the IC dies 350a1 and 350a2 are electrically connected to the PCB 150a by the conductive bump structures 320 disposed between the IC dies 350a1 and 350a2 and the PCB 150a, and the conductive bump structures 320 are electrically connected to the TSV structures 308 and the pads 114.

In some embodiments, the PCB 150a has acoustic ports 105 passing through it. In some embodiments, the acoustic ports 105 formed in the PCB 150a are configured to allow sound waves to enter the cavities 222c1 and 222c2, which comprise spaces in the acoustic ports 305, spaces between the MEMS sensor dies 250a1 and 250a2 and the IC dies 350a1 and 350a2 and spaces between the IC dies 350a1 and 350a2 and the PCB 150a. In some embodiments, the acoustic ports 105 in the PCB 150a are substantially aligned with the acoustic ports 305 in the IC dies 350a1 and 350a2 and the opening portions 205 in the MEMS sensor die 250a1 or 250a2.

As shown in FIG. 7, the MEMS microphone package 500g further comprises adhesives 258 applied between the IC dies 350a1 and 350a2 and the PCB 150a. Therefore, the stacked MEMS sensor wafer 250a and the IC wafer 350a may be secured to the PCB 150a by the adhesives 258. The adhesives 258 are disposed close to the edge 307a of the IC wafer 350a. In addition, the adhesives 258 are disposed between the conductive bump structures 320 in contact with the IC dies 350a1 and the conductive bump structures 320 in contact with the IC dies 350a2. Therefore, the adhesives 258 surrounding the conductive bump structures 320 in contact with the IC die 350a1 and the PCB 150a may acoustically seal the IC die 350a1 to the PCB 150a to form a portion of the cavity 222c1. The adhesives 258 surrounding the conductive bump structures 320 in contact with the IC die 350a2 and the PCB 150a may acoustically seal the IC die 350a2 to the PCB 150a to form a portion of the cavity 222c2 isolated from the cavity 222c1. The adhesives 252 and 258 may serve as isolation features for the cavities 222c1 and 222ac2. In some embodiments, the adhesives 258 may include the same materials as the adhesives 252, 254 and 256.

As shown in FIG. 7, the conductive lid 400c of the MEMS microphone package 500g is connected to the MEMS sensor wafer 250a and the PCB 150a to collectively form cavities 410e1 and 410e2 accommodating the MEMS sensor dies 250a1 and 250a2. In some embodiments, the conductive lid 400c a top portion 400ct, a sidewall portion 400cs1 and an inner wall portion 400cs2. The sidewall portion 400as and an inner wall portion 400cs2 are connected to the top portion 400ct. In some embodiments, as shown in FIG. 7, the sidewall portion 400cs1 of the conductive lid 400c is positioned directly on the PCB 150a. The sidewall portion 400cs1 of the conductive lid 400c may be secured to the PCB 150a by adhesives 260 close to an edge 107a of the PCB 150a. In addition, the inner wall portion 400cs2 of the conductive lid 400c is positioned directly on the MEMS sensor wafer 250a and between the MEMS sensor dies 250a1 and 250a2. The inner wall portion 400cs2 of the conductive lid 400c may be secured (connected) to the MEMS sensor wafer 250a by adhesives 262. In some embodiments, the adhesives 260 and 262 may include the same materials as the adhesives 252, 254, 256 and 258. As shown in FIG. 7, the conductive lid 400c, the PCB 150a, the MEMS sensor wafer 250a and the adhesives 260 and 262 may collectively form cavities 410e1 and 410e2 for the MEMS sensor dies 250a1 and 250a2 and the IC dies 350a1 and 350a2 disposed therein. The cavities 410e1 and 410e2 are configured to contain a volume of air above the MEMS sensor dies 250a1 and 250a2. In some embodiments, the conductive lid 400c comprises materials similar to or the same as the conductive lids 400a and 400b.

FIG. 8 illustrates a cross-sectional view of micro-electro-mechanical system (MEMS) microphone package 500h using the wafer-on-wafer (WoW) packaging technology in accordance with some embodiments of the disclosure. The difference between the MEMS microphone package 500h and the MEMS microphone package 500g is that the MEMS microphone package 500g comprises a printed circuit board (PCB) 150b and a conductive lid 400d.

As shown in FIG. 8, the MEMS microphone package 500h may arrange the acoustic ports 405 in the conductive lids 400d disposed on the PCB 150b. Therefore, the PCB 150b can be formed without acoustic ports passing through it. In some embodiments, the acoustic ports 405 formed in the conductive lids 400*d* are configured to allow sound waves to enter the opening portions 205 in the MEMS sensor dies 250*a*1 and 250*a*2. In some embodiments, the acoustic ports 405 in the conductive lids 400*d* are substantially aligned with the opening portions 205 in the MEMS sensor dies 250*a*1 and 250*a*2, respectively.

As shown in FIG. 8, the adhesives 252 may acoustically seal the MEMS sensor wafer 250*a* to the IC wafer 350*b* to form the cavities 222*b*1 and 222*b*2 to contain a volume of air between the MEMS sensor dies 250*a*1 and 250*a*2 and the IC dies 350*b*1 and 350*b*2.

As shown in FIG. 8, the conductive lid 400*d* of the MEMS microphone package 500*h* is connected to the PCB 150*b* by the adhesives 260 close to an edge 107*b* of the PCB 150*b* to collectively form cavities 410*f*1 and 410*f*2 accommodating the MEMS sensor dies 250*a*1 and 250*a*2. In some embodiments, the conductive lid 400*d* comprises a top portion 400*dt*, a sidewall portion 400*ds*1 and an inner wall portion 400*ds*2. The sidewall portion 400*ds* and the inner wall portion 400*ds*2 are connected to the top portion 400*dt*. In some embodiments, as shown in FIG. 8, the sidewall portion 400*ds*1 of the conductive lid 400*d* is positioned directly on the PCB 150*b*. In addition, the inner wall portion 400*ds*2 of the conductive lid 400*d* is positioned directly on the MEMS sensor wafer 250*a* and between the MEMS sensor dies 250*a*1 and 250*a*2. As shown in FIG. 8, the conductive lid 400*d*, the PCB 150*b*, the MEMS sensor wafer 250*a* and the adhesives 260 and 262 may collectively form the cavities 410*e*1 and 410*e*2 for the MEMS sensor dies 250*a*1 and 250*a*2 and the IC dies 350*b*1 and 350*b*2 disposed therein. The cavities 410*e*1 and 410*e*2 are configured to contain a volume of air above the MEMS sensor dies 250*b*1 and 250*b*2. In some embodiments, the conductive lid 400*d* comprises materials similar to or the same as the conductive lids 400*a*, 400*b* and 400*c*.

The MEMS microphone packages 500*g* and 500*h* are fabricated using the wafer-on-wafer (WoW) packaging technology. The MEMS microphone packages 500*g* and 500*h* may have advantages as described above referring to the MEMS microphone packages 500*a*, 500*b*, 500*e* and 500*f*. In addition, the MEMS microphone packages 500*g* and 500*h* comprising the PCBs 150*a* and 150*b* may provide other design choices.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A micro-electro-mechanical system (MEMS) microphone package, comprising:
   a first micro-electro-mechanical system (MEMS) sensor die having a first surface and a second surface opposite to the first surface;
   an integrated circuit (IC) die stacked on the first surface of the first MEMS sensor die;
   a first conductive lid disposed on the second surface of the first MEMS sensor die;

an additional integrated circuit (IC) die stacked on the first surface of the first MEMS sensor die, wherein the IC die is positioned beside and directly connected to the additional IC die;
   a second MEMS sensor die stacked on and electrically connected to the additional IC die, wherein the first MEMS sensor die is positioned beside and directly connected to the second MEMS sensor die; and
   a second conductive lid disposed on the second MEMS sensor die and positioned beside the first conductive lid, wherein a first sidewall portion of the first conductive lid is positioned directly on the first MEMS sensor die, and a second sidewall portion of the second conductive lid is positioned directly on the second MEMS sensor die,
   wherein the first MEMS sensor die and the second MEMS sensor die are included in a micro-electro-mechanical system (MEMS) sensor wafer, the IC die and the additional IC die are included in an IC wafer provided for the MEMS sensor wafer to be stacked upon, and opposite edges of the MEMS sensor wafer are aligned with the corresponding opposite edges of the IC wafer.

2. The MEMS microphone package as claimed in claim 1, wherein the integrated circuit (IC) die is electrically connected to the first MEMS sensor die by a first conductive bump structure on the first MEMS sensor die and a through silicon via (TSV) structure passing through the IC die.

3. The MEMS microphone package as claimed in claim 1, wherein a micro-electro-mechanical system (MEMS) substrate of the first MEMS sensor die, the IC die and the first conductive lid mounted on the MEMS substrate of the first MEMS sensor die collectively form a housing, such that a diaphragm of the first MEMS sensor die is enclosed in the housing.

4. The MEMS microphone package as claimed in claim 1, wherein the IC die has an acoustic port passing through the IC die such that the first MEMS sensor die is exposed from the acoustic port.

5. The MEMS microphone package as claimed in claim 1, wherein the first conductive lid is connected to the first MEMS sensor die and collectively form a cavity above the first MEMS sensor die.

6. The MEMS microphone package as claimed in claim 1, further comprising:
   a printed circuit board (PCB) provided for the IC die to be stacked upon, such that the IC die is positioned between the first MEMS sensor die and the PCB, wherein the first conductive lid is connected to the first MEMS sensor die and the PCB to collectively form a cavity accommodating the first MEMS sensor die.

7. The MEMS microphone package as claimed in claim 1, wherein the first conductive lid is connected to the MEMS sensor wafer.

8. The MEMS microphone package as claimed in claim 1, wherein the first conductive lid and the first MEMS sensor die form a first cavity over the first MEMS sensor die, the second conductive lid and the second MEMS sensor die form a second cavity over the second MEMS sensor die and physically isolated from the first cavity, and the first cavity and the second cavity do not overlap each other in a direction substantially vertical to a top surface of the IC die.

* * * * *